(12) United States Patent
Truchan et al.

(10) Patent No.: US 6,455,166 B1
(45) Date of Patent: Sep. 24, 2002

(54) METALLIC SUBSTRATES FOR HIGH TEMPERATURE SUPERCONDUCTORS

(75) Inventors: Thomas G. Truchan, Chicago; Dean J. Miller, Darien; Kenneth C. Goretta, Downers Grove; Uthamalingam Balachandran, Hinsdale; Robert Foley, Chicago, all of IL (US)

(73) Assignee: The University of Chicago, Chicago, IL (US)

(*) Notice: Subject to any disclaimer, the term of this patent is extended or adjusted under 35 U.S.C. 154(b) by 0 days.

(21) Appl. No.: 09/568,890

(22) Filed: May 11, 2000

(51) Int. Cl.⁷ .................. H01L 39/04; C22C 19/03; B32B 15/04

(52) U.S. Cl. .............. 428/471; 428/457; 428/469; 428/697; 428/699; 428/701; 428/702; 505/236; 505/238; 505/239; 420/441; 148/426; 148/675

(58) Field of Search .................. 505/236, 237, 505/238, 239; 428/469, 471, 472, 697, 699, 701, 702, 457; 148/426, 675; 420/441

(56) References Cited

U.S. PATENT DOCUMENTS 5,741,377 A    4/1998   Goyal et al. .......... 148/512
5,898,020 A *  4/1999   Goyal et al. .......... 505/239
5,958,599 A    9/1999   Goyal et al. .......... 428/457
5,964,966 A   10/1999   Goyal et al. .......... 148/426
5,972,847 A   10/1999   Feenstra et al. ........ 505/473

OTHER PUBLICATIONS

High $T_c$ vol. 14 No. 1, Jan. 1, 2000.

The American Physical Society, 1990 vol. 41, No. 7, Physcial Review B no month.

* cited by examiner

Primary Examiner—Deborah Jones
Assistant Examiner—Stephen Stein
(74) Attorney, Agent, or Firm—Emrich & Dithmar

(57) ABSTRACT

A biaxially textured face-centered cubic metal article having grain boundaries with misorientation angles greater than about 8° limited to less than about 1%. A laminate article is also disclosed having a metal substrate first rolled to at least about 95% thickness reduction followed by a first annealing at a temperature less than about 375° C. Then a second rolling operation of not greater than about 6% thickness reduction is provided, followed by a second annealing at a temperature greater than about 400° C. A method of forming the metal and laminate articles is also disclosed.

19 Claims, 5 Drawing Sheets

Routes to Coated Conductors

Roll Assisted Biaxially Textured Substrates (RABiTS™)

Ion Beam Assisted Deposition (IBAD)

METALLIC SUBSTRATES FOR HIGH TEMPERATURE SUPERCONDUCTORS

The United States Government has rights in this invention pursuant to Contract No. W-31-109-ENG-38 between the U.S. Department of Energy (DOE) and The University of Chicago representing Argonne National Laboratory.

FIELD OF THE INVENTION

The present invention relates to biaxially textured metallic substrates and articles made therefrom, and more particularly to such substrates and articles made by rolling and heat treating a metallic substrate to obtain biaxial texture, followed by deposition of epitaxial materials thereon, with an emphasis on superconductors.

BACKGROUND OF THE INVENTION

Current materials research aimed at fabricating high-temperature superconducting ceramics in conductor configurations for bulk, practical applications is largely focused on powder-in-tube methods. Such methods have proved quite successful for the Bi—(Pb)—Sr—Ca—Cu—O (BSCCO) family of superconductors due to their unique mica-like mechanical deformation characteristics. In high magnetic fields, this family of superconductors is generally limited to applications below approximately 30 K. In the Re—Ba—Cu—O (REBCO), where RE denotes a rare earth element), Tl—(Pb, Bi)—(Sr—Ba)—Ca—Cu—O and (Hg—Pb)—Sr—Ba)—Ca—Cu—O families of superconductors, some of the compounds have much higher intrinsic limits and can be used at higher temperatures and in higher magnetic fields. It has been demonstrated that these superconductors possess high critical current densities ($J_c$) at high temperatures when fabricated in essentially single-crystal forms as epitaxial films on single crystal substrates such as $SrTiO_3$ and $LaAlO_3$. These superconductors have so far proven intractable to conventional ceramics and materials processing techniques to form long lengths of conductor with $J_c$ comparable to epitaxial films. This is primarily because of the "weak-link" effect.

It has been demonstrated that in REBCO, biaxial texture is necessary to obtain high transport critical current densities. High $J_c$'s have been reported in polycrystalline REBCO thin films deposited on special substrates on which a biaxially textured non-superconducting oxide buffer layer is first deposited using ion-beam assisted deposition (IBAD) techniques. IBAD is a slow, expensive process, and difficult to scale up for production of lengths adequate for many applications.

High $J_c$'s have also been reported in polycrystalline REBCO melt-processed bulk material which contains primarily small angle grain boundaries. Melt processing is also considered too slow for production of practical lengths.

Thin-film materials having perovskite-like structures are important in superconductivity, ferroelectrics, and electro-optics. Many applications using these materials require, or would be significantly improved by, single-crystal, c-axis oriented perovskite-like films grown on single-crystal or highly aligned metal or metal-coated substrates.

For instance, $YBa_2Cu_3O_x$ (YBCO) is an important superconducting material for the development of superconducting current leads, transmission lines, motors and magnetic windings, and other electrical conductor applications. When cooled below their transition temperature, superconducting materials have no resistance to direct electric current and carry electrical current without heating up. One technique for fabricating a superconducting wire or tape is to deposit a YBCO film on a metallic substrate. Superconducting YBCO has been deposited on polycrystalline metals or alloys in which the YBCO is c-axis oriented, but not aligned in-plane. To carry high electrical currents and remain superconducting, however, the YBCO films must be biaxially textured, with effectively no large-angle grain boundaries, since such grain boundaries are detrimental to the current-carrying capability of the material. YBCO films deposited on polycrystalline metallic or alloy substrates do not generally meet this criterion.

Goyal et al. have disclosed in U.S. Pat. Nos. 5,898,020; 5,958,599; and 5,964,966, as well as references disclosed therein, various inventions relating to preparing textured biaxial materials, the disclosures of the above-identified patents are incorporated by reference in their entireties. The method disclosed by Goyal et al. Is termed Roll-Assisted Biaxial Textured Substrates, or RABiTS, for short.

OBJECTS OF THE INVENTION

Accordingly, it is an object of the present invention to provide a new and improved method for fabricating elemental, alloy and laminated structures having biaxial texture.

It is another object of the present invention to provide a method of producing epitaxial superconductors on Ni, Ni alloys other face-centered cubic metals or alloys, and laminated structures having biaxial texture by practically scalable processes.

It is a further object of the present invention to provide vastly improved c-axis oriented, biaxially textured, superconducting YBCO films, or other perovskite-like materials, such as $SrTiO_3$, reproducibly obtainable on biaxially textured Ni, Ni alloys other face-centered cubic metals or alloys or other metals on which an epitaxial buffer layer can be formed.

It is a further object of the present invention to provide c-axis oriented, biaxially textured perovskite-like ferroelectric films on face-centered-cubic substrates for metal/ferroelectric/metal multilayer devices.

A still further object of the invention is to provide new methods of preparing textured materials having less than 1% grain boundary misorientation angles greater than about 8°.

Further and other objects of the present invention will become apparent from the description contained herein.

SUMMARY OF THE INVENTION

In accordance with an aspect of the present invention, a biaxially textured elemental or alloy article includes a rolled and annealed biaxially textured metal substrate, the metal having a face-centered cubic crystalline structure, the biaxially textured substrate being characterized in that less than about 1% of grain boundaries have misorientation angles greater than about 8°.

In accordance with a further aspect of the present invention, a biaxially textured laminate article includes a rolled and annealed biaxially textured base metal substrate, the base metal having a face-centered cubic close-packed crystalline structure, having an epitaxial layer of another material on a surface thereof, the biaxially textured substrate being characterized in that less than 1% of grain boundaries have misorientation angles greater than about 8°.

Yet another object or aspect of the invention is to provide a novel process or method involving a combination of low and high temperature annealing to produce the articles described above.

A still further object or aspect of the invention is to provide a novel process or method of the type described using separate layers and small deformation steps.

The invention consists of certain novel features and a combination of parts hereinafter fully described, illustrated in the accompanying drawings, and particularly pointed out in the appended claims, it being understood that various changes in the details may be made without departing from the spirit, or sacrificing any of the advantages of the present invention.

BRIEF DESCRIPTION OF THE DRAWINGS

For the purpose of facilitating an understanding of the invention, there is illustrated in the accompanying drawings a preferred embodiment thereof, from an inspection of which, when considered in connection with the following description, the invention, its construction and operation, and many of its advantages should be readily understood and appreciated.

DESCRIPTION OF THE PREFERRED EMBODIMENT

Figure 1:
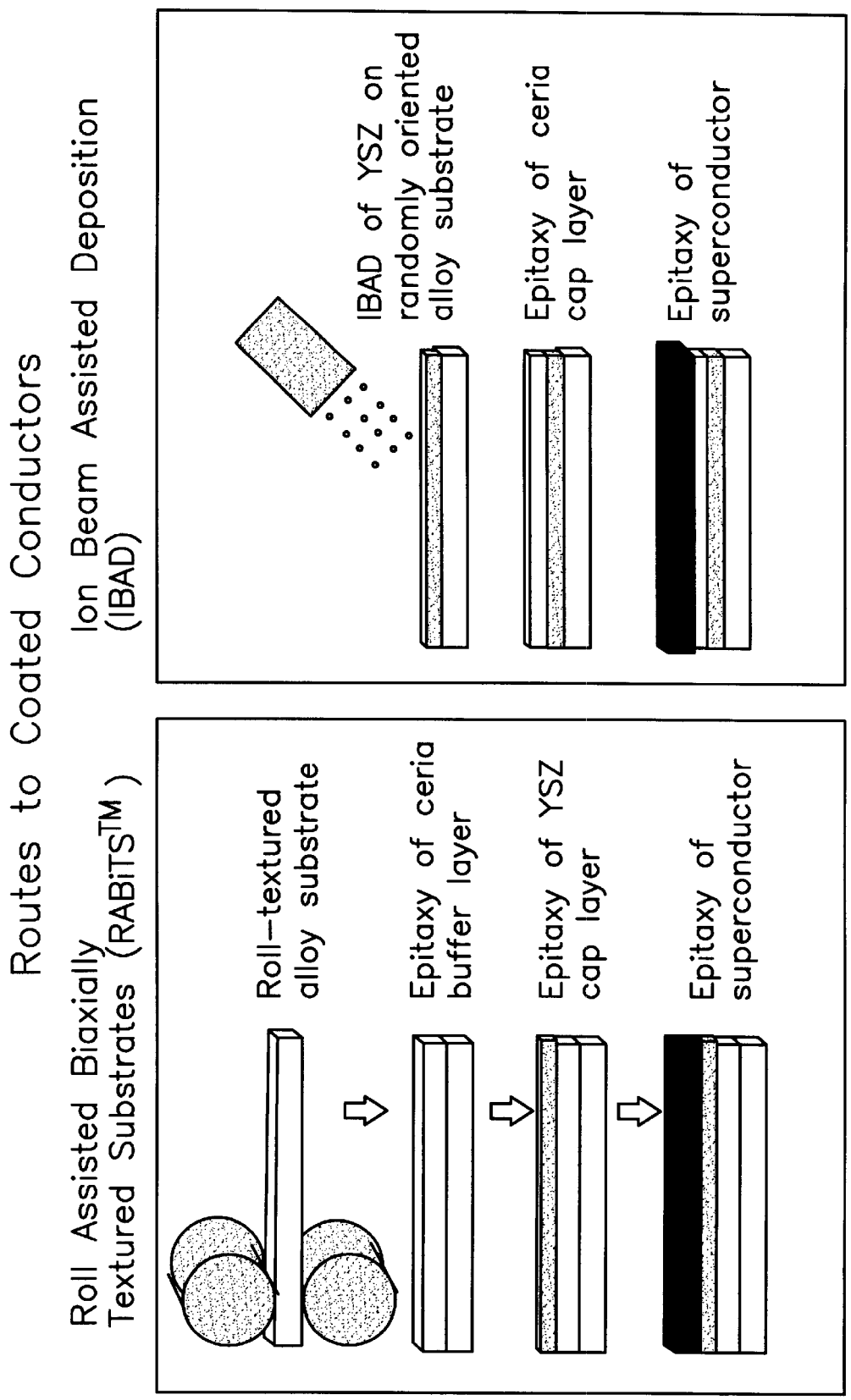
FIG. 1 is schematic representation of samples prepared by the RABiTS and IBAD processes for producing textured materials.

A biaxially textured substrate or sheath material is fabricated by industrially scalable rolling techniques as disclosed in the referenced Goyal et al. patents and other references in which the FCC metal is rolled to a greater than 90% and preferably greater than 95% deformation and annealed at high temperatures. The substrate can then be coated/reacted by a variety of techniques to produce chemically compatible, textured barrier layers. An epitaxial layer of another material is then grown on the textured substrate (or on a barrier layer as the case may be) using any of a variety of techniques. The texture from the substrate (or the barrier layer) is then induced in the epitaxial layer. It is thereby possible to deposit a biaxially aligned superconductor with high critical current density.

When a polycrystalline material is subjected to the rolling process, plastic flow causes reorientation of the lattice of individual grains of the polycrystalline material and tends to develop a texture or preferred orientation of the lattice in the grains. The progress of reorientation is gradual; the orientation change proceeds as plastic flow continues, until a texture is reached that is stable against indefinite continued flow of a given type. The nature of the stable deformation texture and the manner in which it is approached is characteristic of the material and of the nature of the flow throughout the deformation process (i.e., the magnitude of the three principal strains at all points within the specimen and at successive times during the process). The texture development is strongly influenced by temperature, particularly if the temperature of deformation is high enough for recrystallization to take place. Other effects of temperature include variation of the stacking fault energy and hence the operative deformation mechanisms. In general, plastic strains near the surface of a rolled specimen may differ from those in the interior and may produce textures that vary with depth below the surface. Hence specific rolling procedures, which are described in the referenced and incorporated Goyal et al. patents, are used to ensure reasonably consistent textures through the thickness of the work piece.

While forward rolling alone may result in homogeneous texture through the thickness of the sheet, it has been found that reverse rolling (rolling direction is reversed after each pass) produces much better results in most materials. For the most part, reverse rolling is preferred over forward rolling. The rolling speed and reduction per pass are also important parameters. While rolling speed may be important in the texture development, it effect is not dominating. In general, higher rolling speeds are desirable for economical purposes. Reduction per pass during rolling is also important for texture development. Generally, less than 30% reduction per pass is desirable, although in some cases higher reductions per pass may also be required. The lubrication employed during rolling is also an important variable. Depending on the texture desired, either no lubricant or some lubricant like light mineral oil, heavy mineral oil, kerosene, etc. are employed to ensure homogeneous texture development. Grain size of the starting material and prior heat treatments and deformation history is also important in determining the texture development. In general, prior to rolling, a fine grain size is desired and the initial heat treatments and deformations are designed to give a random texture in the starting material. The above variables are now known in the art and one skilled in this art can manipulate the above-mentioned variables to obtain a variety of results.

The development of an annealing texture involves several fundamental mechanisms. An annealing texture may develop from recovery without recrystallization (in which case it would be expected to duplicate the texture present before annealing), from primary recrystallization, or from grain growth subsequent to recrystallization. Grain size distribution can remain normal throughout the process, or a few grains may grow very large while the rest remain approximately unchanged until devoured by the large ones. The latter type of grain growth, referred to as "secondary recrystallization" or "discontinuous", is generally considered to be abnormal.

It is known that the $J_c$ critical current density through a grain boundary may be reduced significantly for misorientation angles greater than about 8°. It is thus desirable to obtain superconducting deposits in which the number of grain boundaries with misorientation angles greater than about 8° is minimized. This is accomplished if the texture of the substrate is so sharp that grain orientations vary by no more than about 8°. Useful superconducting layers may be obtained using substrates with larger spread in grain orientation, but the better the substrate texture, the better the properties of the superconductor deposit are expected to be.

In a cube texture, a cube axis, (100), lies parallel to the plane of the sheet and a cube edge, [001], is parallel to the rolling direction, i.e., {100}<001>. This texture resembles a single crystal with subgrains, but may contain a minor amount of material in twin relation to the principal orientation.

A method for producing biaxially textured substrates has been used to produce a sharp cube texture on FCC metals like copper (Cu) or nickel (Ni). In this process, the metal is first thermomechanically textured, followed by epitaxial growth of additional metal or ceramic layers. Epitaxial YBCO films grown on such substrates resulted in high critical current $I_c$ and high $J_c$.

Figure 5:
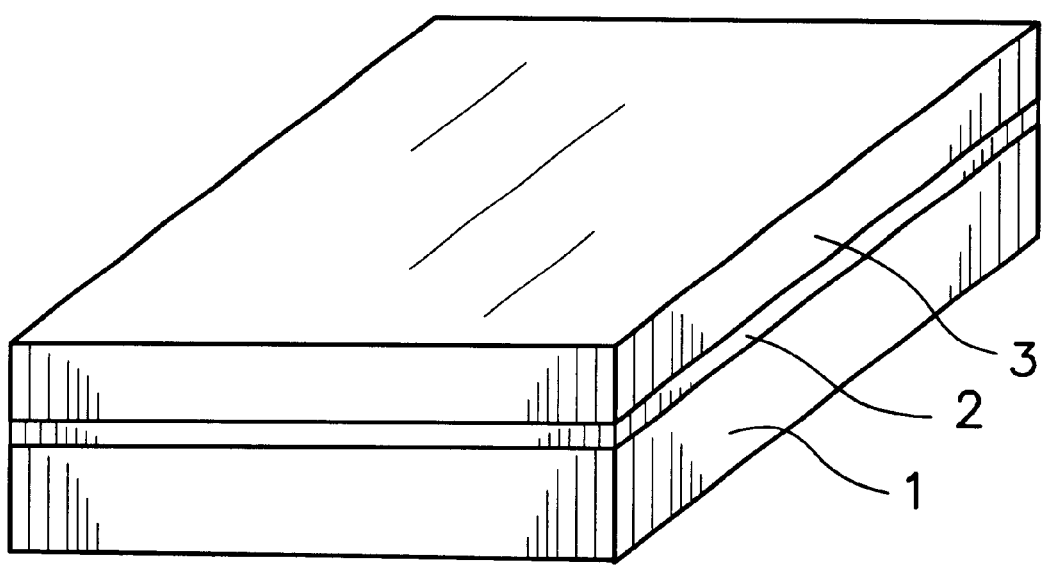
FIG. 5 is a schematic representation of a biaxially textured substrate having various epitaxial layers deposited thereon.

The disclosures concerning rolling processes and annealing processes in the heretofore mentioned Goyal et al. patents have produced materials as described and as shown in the schematic of the RABiTS procedure schematically depicted in FIG. 1. IBAD may also be used to deposit materials such as yittria stabilized zirconia (YSZ) and/or ceria ($CeO_2$). Finally, the processes of the prior art can then be used to deposit a superconductor layer on top of the buffer layer. A schematic diagram of such a composition is shown in FIG. 5, in which the biaxially textured substrate 1 has a epitaxial buffer layer 2 deposited thereon upon which is deposited a second epitaxial buffer layer 3 which may be a superconductor, ferroelectric device, or other electromagnetic or electro-optical device. In some cases, buffer layer 2 is not necessary and in other cases multiple buffer layers are preferred or necessary.

Figure 2:
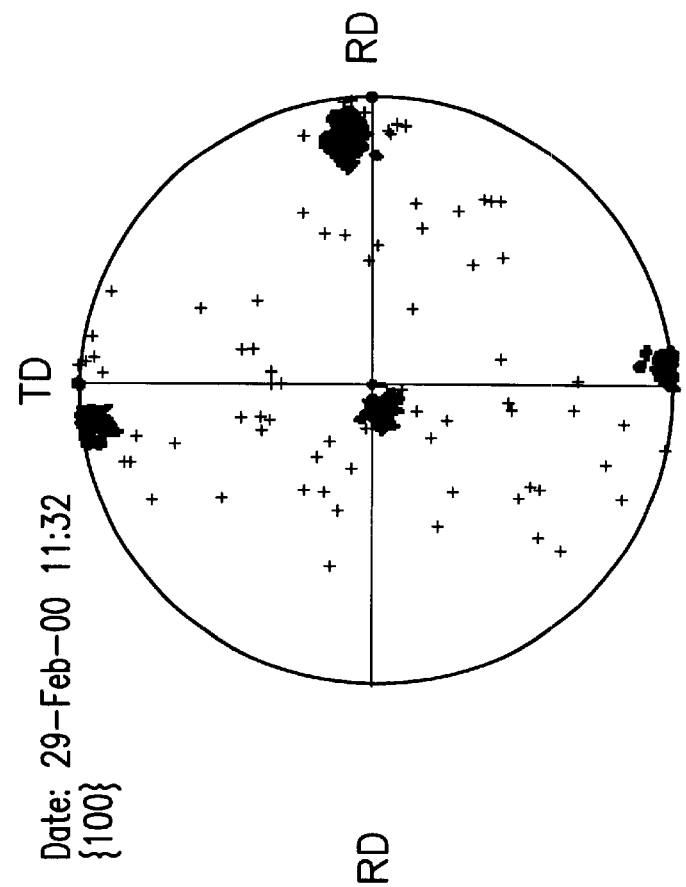
FIG. 2 is a [100] X-ray pole figure for material produced using the RABiTS process and the capital inventive process (ANL)
Figure 2:
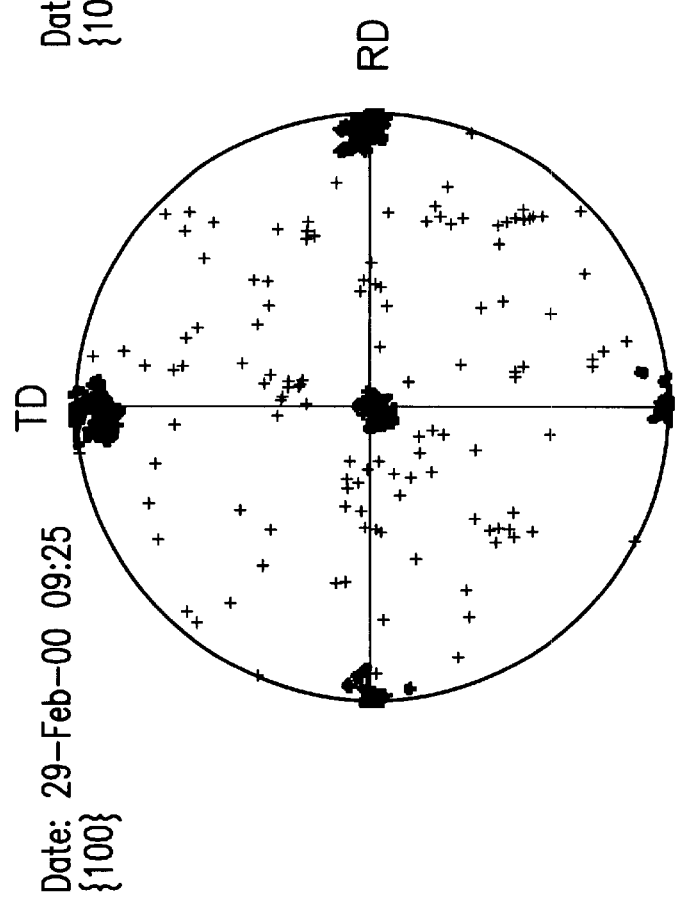
Figure 3:
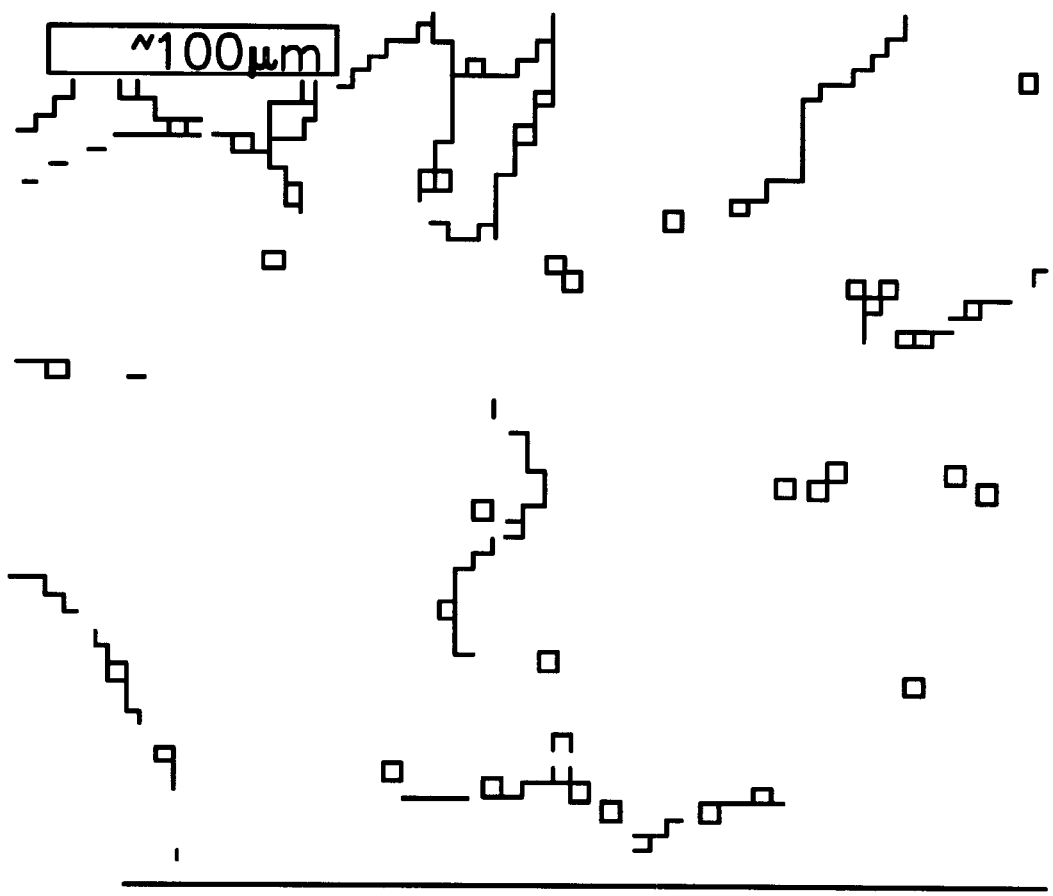
FIG. 3 is a representation of crystallographic orientation obtained from electron diffraction in SEM for boundaries with more than 8° misorientation between adjacent grains for material produced by the RABiTS process.
Figure 4:
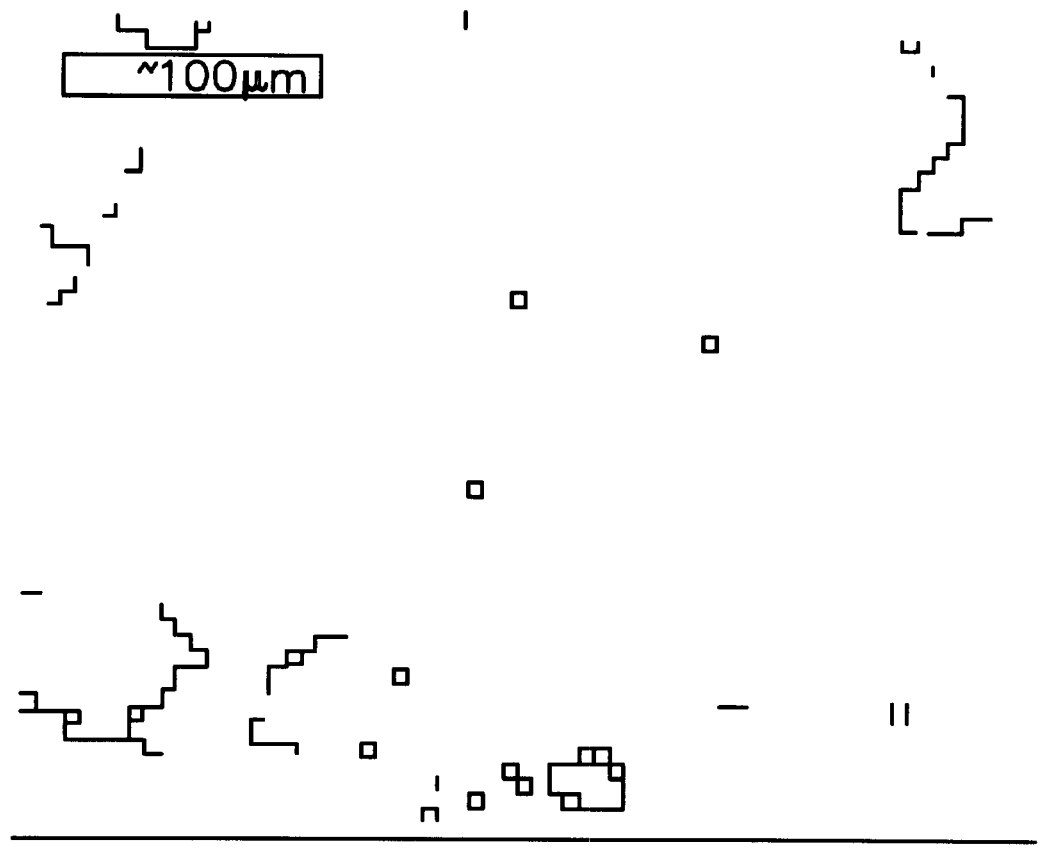
FIG. 4 is a representation of crystallographic orientation obtained from electron diffraction in SEM for boundaries with more than 8° misorientation between adjacent grains for material produced by the inventive process.

However, the methods of producing the biaxially textured material disclosed in the Goyal et al. patents result in a material which when examined has ⅔ more grain boundaries with misorientations of about 8° or greater than material made in accordance with the present invention, see FIGS. 2–4. The inventive process provides material in which less than 1% of the grain boundaries have misorientations greater than about 8°. This is a substantial improvement over materials produced according to the prior art method (see FIG. 3) and results in articles including those illustrated in FIG. 4 which are substantially improved over the prior art.

The inventive method requires four steps in the preparation of the substrate material, as opposed to the conventional rolling-annealing steps disclosed in the RABiTS process, which includes only two steps. As disclosed in the referenced Goyal et al. patents, the conventional rolling-annealing step calls for the metal substrate to be rolled in stages to a greater than 95% deformation using conventional rolls. Thereafter, the deformed material is annealed in a reducing atmosphere somewhere between 400°–1000° C. Reference to the examples set forth in the various Goyal et al. patents will provide a number of examples of the deformation and the annealing process both with respect to deformation rate, temperature, rolling protocol including both forward and backward rolling.

The inventive process which results in the materials illustrated in FIG. 4 requires four steps. The initial deformation reduction is as described in the prior art and specifically in the Goyal et al. patents. Preferably, greater than 90% and most preferably greater than 95% deformation is obtained at no greater than 30% deformation per pass, as described in the Goyal et al. patents. However, after the initial deformation has been completed, an annealing step which takes place in an inert or reducing atmosphere is performed at a lower than ordinary temperature. 375° C. is the maximum temperature employed in this annealing step with an annealing temperature preferably being in the 200° C.–300° C. range and most preferably about 250° C. The times and other factors of the annealing step may be performed in a conventional manner provided that the temperature limitation of the first annealing step is observed.

Thereafter, a canning process is used, which is a simultaneous rolling of both sides of the work piece (substrate) in which sacrificial or can metal is used on both sides of the substrate. This canning step preferably uses the same or similar metal for the can or sacrificial metal as the substrate metal. Also preferably but not necessarily, the can metal should be approximately the same thickness as the substrate metal. The canning process is used only for a reduction in thickness in the substrate metal of not greater than about 6% at a rate of between about 1–6% per pass. Both forward as well as reverse rolling can be used. Thereafter, a second anneal, also in an inert or reducing atmosphere, typically 96% Argon and 4% hydrogen, is performed, now at a higher temperature than the first anneal, preferably in the range of 400°–1000° C. and most preferably at about 800° C. for a time sufficient to produce a superior cube texture with grain size being about 100 micrometers. The comparison between the Goyal et al. material of FIG. 2 and the material of the present invention FIG. 3, dramatically illustrates the improved texture of the material prepared according to the invention. As stated in the Goyal et al. patents, the number of grain boundaries with misorientation angles greater than approximately 820 must be minimized and the material of the subject invention minimizes the number of grain boundaries with misorientation angles greater than 8° to less than 1% of the material. This is a significant improvement over the prior art, and particularly material prepared according to the teaching of the Goyal et al. references illustrated in FIGS. 2 and 3 having grain boundaries with misorientation angles greater than about 8° than does the inventive material illustrated in FIGS. 2 and 3.

Although a variety of face-centered-cubic (FCC) materials disclosed in the various Goyal et al. patents are useful, the preferred substrate is a nickel or nickel alloy. A variety of deposition processes may be used to deposit the various layers on the textured substrate material. The invention includes, but is not limited to, such known processes as vacuum deposition, sputtering and other methods for depositing material on the textured substrate and is well within the skill of the art. For instance, by way of illustration only without limiting the invention, example 11 of the Goyal et al. U.S. Pat. No. 5,898,020 discloses a biaxially textured laminate article which may be produced by combining the texturing process of the subject invention as described above with the sputtering of example 11 and the inventive rolling previously described along with low and high temperature annealing to produce a superior textured metal substrate and laminate having misorientation angles greater than about 8° limited to less than about 1%, see FIGS. 2 and 4. Also, by way of illustration without limitation other examples contained in any of the Goyal et al. patents cited above may be used with the inventive process described herein to produce novel materials having the superior properties described and illustrated herein.

While there has been disclosed what is considered to be the preferred embodiment of the present invention, it is understood that various changes in the details may be made without departing from the spirit, or sacrificing any of the advantages of the present invention.

The embodiments of the invention in which an exclusive property or privilege is claimed are defined as follows:

1. A biaxially textured face-centered cubic metal article wherein the grain boundaries with misorientation angles greater than about 8° are less than about 1%.

2. The article of claim 1, and further including a plurality of layers of epitaxial non-metal materials on said face-centered-cubic metal.

3. The article of claim 1, wherein the metal is Ni, a Ni alloy, or other FCC metal.

4. The article of claim 2, wherein at least one of the layers has superconducting properties.

5. The article of claim 4, wherein at least one of the metals is Ni or a Ni alloy.

6. A biaxially textured laminate article comprising a metal substrate first rolled to at least about 95% thickness reduction followed by a first annealing at a temperature less than about 375° C., followed by a second rolling operation of not greater than about 6% thickness reduction, followed by a second annealing at a temperature greater than about 400° C., said metal having a face-centered-cubic crystalline structure having less than about 1% grain boundaries with misorientation angles greater than about 8° and having an epitaxial layer of another material on the surface thereof.

7. The article of claim 6, wherein the metal is Ni, a Ni alloy, or other FCC metal.

8. The article of claim 6, wherein at least one of the layers has superconducting properties.

9. The article of claim 8, wherein the metal is Ni, a Ni alloy, or other FCC metal.

10. A combination of a layer of an epitaxial YBCO film on a biaxially textured face-centered-cubic metal substrate, wherein less than about 1% of grain boundaries of the metal substrate have misorientation angles greater than about 8°.

11. The combination of claim 10, wherein the face-centered-cubic metal substrate has different metal layer thereon.

12. The combination of claim 11, wherein a ceramic layer is between the YBCO film and the metal substrate.

13. A method of forming a biaxially textured face-centered-cubic metal, comprising rolling the metal to provide at least about 90% deformation, annealing the rolled metal at a temperature not greater than about 375° C., canning the annealed metal to provide less than about 6% deformation, and annealing the canned metal at a temperature greater than 400° to produce a biaxially textured metal wherein less than about 1% of grain boundaries have misorientation angles greater than about 8°.

14. The method of claim 13, wherein the first rolling reduces the thickness by not less than about 95%.

15. The method of claim 14, wherein the first annealing is at a temperature less than about 300° C.

16. The method of claim 15, wherein the canning uses metal protective layers substantially the same as the metal being canned.

17. The method of claim 16, wherein the second annealing is at a temperature greater than 400° C.

18. The method of claim 16, wherein the second annealing is at a temperature of about 800° C.

19. The method of claim 16, wherein annealing takes place under an inert or reducing atmosphere.

* * * * *

UNITED STATES PATENT AND TRADEMARK OFFICE
CERTIFICATE OF CORRECTION

PATENT NO. : 6,455,166 B1　　　　　　　　　　　　　　　　　　　　　　　　Page 1 of 1
DATED : September 24, 2002
INVENTOR(S) : Thomas Truchan et al.

It is certified that error appears in the above-identified patent and that said Letters Patent is hereby corrected as shown below:

Column 3,
Line 25, in the "BRIEF DESCRIPTION OF THE DRAWINGS", delete the word "capital".

Signed and Sealed this

Twenty-ninth Day of April, 2003

JAMES E. ROGAN
*Director of the United States Patent and Trademark Office*